(12) United States Patent
Filipovic et al.

(10) Patent No.: US 8,729,977 B2
(45) Date of Patent: May 20, 2014

(54) COMPENSATION FOR CRYSTAL FREQUENCY USING MULTIPLE TEMPERATURES

(75) Inventors: Daniel Fred Filipovic, Solana Beach, CA (US); Vishal Agarwal, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 62 days.

(21) Appl. No.: 13/536,728

(22) Filed: Jun. 28, 2012

(65) Prior Publication Data

US 2013/0328634 A1    Dec. 12, 2013

Related U.S. Application Data

(60) Provisional application No. 61/658,773, filed on Jun. 12, 2012.

(51) Int. Cl.
*H03L 1/04* (2006.01)

(52) U.S. Cl.
USPC .......................................... 331/176; 331/158

(58) Field of Classification Search
USPC .......................................... 331/70, 176, 158
See application file for complete search history.

(56) References Cited

U.S. PATENT DOCUMENTS

| | | | |
|---|---|---|---|
| 6,420,938 B1 * | 7/2002 | Hoff et al. ................ 331/176 |
| 6,522,871 B1 | 2/2003 | Patrick et al. | |
| 6,542,044 B1 | 4/2003 | Berquist et al. | |
| 7,010,307 B2 | 3/2006 | Abraham | |
| 7,649,426 B2 | 1/2010 | Stolpman | |
| 8,223,070 B2 | 7/2012 | Vasilyev et al. | |
| 2010/0289589 A1 | 11/2010 | Ito et al. | |
| 2011/0316742 A1 | 12/2011 | Eade | |

FOREIGN PATENT DOCUMENTS

EP    2244386 A1    10/2010
WO    2008033243 A2    3/2008

OTHER PUBLICATIONS

International Search Report and Written Opinion—PCT/US2012/045002—ISAEPO—Aug. 28, 2013.

* cited by examiner

*Primary Examiner* — Joseph Chang
(74) *Attorney, Agent, or Firm* — Hunter Clark PLLC (57) ABSTRACT

A method in a mobile communication device includes: measuring a first temperature associated with a crystal configured to provide a reference signal having a frequency; measuring a second temperature associated with a component that is coupled to the crystal by an electrically and thermally conductive line; and compensating, based upon the measuring of the first and second temperatures, for a change in the frequency of the reference signal of the crystal.

32 Claims, 6 Drawing Sheets

COMPENSATION FOR CRYSTAL FREQUENCY USING MULTIPLE TEMPERATURES

CROSS-REFERENCE TO RELATED APPLICATIONS

This application claims the benefit of U.S. Provisional Application No. 61/658,773, filed Jun. 12, 2012, entitled "Predicting Crystal Temperature Using a Combination of Multiple Temperature Sensors," which is assigned to the assignee of this application, and is expressly incorporated herein by reference.

BACKGROUND

Many devices today include satellite navigation system (SPS) capabilities for determining location of the devices. For example, mobile phones, smartphones, laptop computers, tablet computers, etc. may use signals from the Global Positioning System (GPS), or other SPS, to help determine location.

To acquire and track SPS signals, an oscillation frequency from an oscillator is used. To generate this frequency signal, a crystal is often used. Crystals, however, produce signals whose frequencies may vary with temperature. Changes in temperature of the crystals, therefore, may inhibit the ability of the device using the crystal to acquire and track the SPS signals.

SUMMARY

An example mobile device includes: a memory that includes processor-readable instructions; and a processor communicatively coupled to the memory and configured to process the instructions to: obtain indications of first and second temperatures, the first temperature being a temperature associated with a crystal configured to provide a reference signal having a frequency, and the second temperature being a temperature associated with a component thermally coupled to the crystal; and compensate, based upon the first and second temperatures, for a change in a value of a reference frequency of the crystal.

Implementations of such a mobile device may include one or more of the following features. The processor is configured to process the instructions to: determine an estimated temperature value, associated with a temperature of the crystal, based on the first and second temperatures; determine an estimated frequency value, associated with a reference frequency of the crystal, based upon the estimated crystal temperature; and compensate for the change based upon the estimated value associated with the reference frequency. The estimated temperature value is an estimated actual temperature of the crystal and the estimated frequency value is an estimated actual reference frequency of the crystal. The estimated temperature value is an estimated change in actual temperature of the crystal and the estimated frequency value is an estimated change in actual reference frequency of the crystal.

Also or alternatively, implementations of the mobile device may include one or more of the following features. The processor is configured to process the instructions to determine the estimated crystal temperature based on a difference of the first and second temperatures. The processor is configured to process the instructions to determine the estimated crystal temperature in response to a difference of the first and second temperatures having a value indicative of the first temperature undesirably deviating from an actual temperature of the crystal.

Also or alternatively, implementations of the mobile device may include one or more of the following features. The device is a mobile telecommunications device, the device further including: a receiver configured to receive location signals from a satellite; the crystal; a first temperature sensor disposed proximate to the crystal and configured to measure the first temperature; the component thermally connected to the crystal by an electrically and thermally conductive line; and a second temperature sensor disposed and configured to measure the second temperature, where the component is a voltage source or an oscillator and is coupled to the oscillator by a voltage line. The first temperature sensor is a thermistor. The second temperature sensor is disposed to measure heat provided to or removed from the crystal that will affect a temperature of the crystal faster than indicated by the first temperature measured by the first temperature sensor. The processor is configured to compensate for the change in the value of the reference frequency of the crystal to process the location signals before a change in the temperature of the crystal due to heat transfer between the component and the crystal via the electrically and thermally conductive line is reflected in the first temperature.

An example method in a mobile communication device includes: measuring a first temperature associated with a crystal configured to provide a reference signal having a frequency; measuring a second temperature associated with a component that is coupled to the crystal by an electrically and thermally conductive line; and compensating, based upon the measuring of the first and second temperatures, for a change in the frequency of the reference signal of the crystal.

Implementations of such a method may include one or more of the following features. The method further includes determining an estimated frequency value of the reference signal based upon the first and second temperatures. Determining the estimated frequency value includes determining an estimated change in the frequency of the reference signal based upon the first and second temperatures. Measuring the second temperature measures an indication of heat provided to or removed from the crystal that will affect a temperature of the crystal faster than indicated by the first temperature. Compensating for the change in the frequency of the reference signal is performed in response to a difference of the first and second temperatures having a value indicative of the first temperature undesirably deviating from an actual temperature of the crystal. The difference of the first and second temperatures having a value indicative of the first temperature undesirably deviating from an actual temperature of the crystal includes the value of the difference exceeding a threshold. The method further includes determining an estimated crystal temperature value based on the first and second temperatures, where compensating for the change in the frequency of the reference signal is based on the estimated crystal temperature value. Determining the estimated crystal temperature value is based on a difference of the first and second temperatures.

Another example mobile device includes: first means for measuring a first temperature associated with a crystal configured to provide a reference signal having a frequency; second means for measuring a second temperature associated with a component that is coupled to the crystal by an electrically and thermally conductive line; and compensating means for compensating, based upon the measuring of the first and second temperatures, for a change in the frequency of the reference signal of the crystal.

Implementations of such a mobile device may include one or more of the following features. The mobile device further includes frequency means for determining an estimated frequency value of the reference signal based upon the first and second temperatures. The frequency means is configured to determine the estimated frequency value by determining an estimated change in the frequency of the reference signal based upon the first and second temperatures. The second means for measuring is configured to measure the second temperature by measuring an indication of heat provided to or removed from the crystal that will affect a temperature of the crystal faster than indicated by the first temperature. The compensating means is configured to compensate for the change in the frequency of the reference signal in response to a difference of the first and second temperatures having a value indicative of the first temperature undesirably deviating from an actual temperature of the crystal. The difference of the first and second temperatures having a value indicative of the first temperature undesirably deviating from an actual temperature of the crystal includes the value of the difference exceeding a threshold. The mobile device further includes estimating means for determining an estimated a crystal temperature value based on the first and second temperatures, where the compensating means is configured to compensate for the change in the frequency of the reference signal is based on the estimated crystal temperature value. The estimating means is configured to determine the estimated crystal temperature value based on a difference of the first and second temperatures.

An example processor-readable storage medium includes processor-readable instructions configured to cause a processor to: obtain indications of first and second temperatures, the first temperature being a temperature associated with a crystal configured to provide a reference signal having a frequency, and the second temperature being a temperature associated with a component thermally coupled to the crystal; and compensate, based upon the first and second temperatures, for a change in a value of a reference frequency of the crystal.

Implementations of such a storage medium may include one or more of the following features. The instructions are configured to cause the processor to: determine an estimated temperature value, associated with a temperature of the crystal, based on the first and second temperatures; determine an estimated frequency value, associated with a reference frequency of the crystal, based upon the estimated crystal temperature; and compensate for the change based upon the estimated value associated with the reference frequency. The estimated temperature value is an estimated actual temperature of the crystal and the estimated frequency value is an estimated actual reference frequency of the crystal. The estimated temperature value is an estimated change in actual temperature of the crystal and the estimated frequency value is an estimated change in actual reference frequency of the crystal. The instructions are configured to cause the processor to determine the estimated crystal temperature based on a difference of the first and second temperatures. The instructions are configured to cause the processor to determine the estimated crystal temperature in response to a difference of the first and second temperatures having a value indicative of the first temperature undesirably deviating from an actual temperature of the crystal.

Items and/or techniques described herein may provide one or more of the following capabilities, as well as other capabilities not mentioned. Temperatures of a crystal of a crystal oscillator may be more accurately determined by accounting for heat transfer between the crystal and another component connected to the crystal. A reference frequency provided by a crystal of a crystal oscillator may be more accurately determined by accounting for heat transfer between the crystal and another component connected to the crystal. Other capabilities may be provided and not every implementation according to the disclosure must provide any, let alone all, of the capabilities discussed.

DETAILED DESCRIPTION

As used herein, a mobile terminal (MT), sometimes referred to as a mobile device, a mobile station (MS) or user equipment (UE), is a device such as a cellular phone, mobile phone or other wireless communication device, personal communication system (PCS) device, personal navigation device (PND), Personal Information Manager (PIM), Personal Digital Assistant (PDA), laptop or other suitable mobile device which is capable of receiving wireless communication and/or navigation signals. The term mobile terminal includes devices that communicate with a personal navigation device (PND), such as by short-range wireless, infrared, wireline connection, or other connection—regardless of whether satellite signal reception, assistance data reception, and/or position-related processing occurs at the device or at the PND. Also, the term mobile terminal includes devices, including wireless communication devices, computers, laptops, etc. that are capable of communication with a server, such as via the Internet, WiFi, or other network, and regardless of whether satellite signal reception, assistance data reception, and/or position-related processing occurs at the device, at a server, or at another device associated with the network. Any operable combination of the above are also considered a mobile terminal.

Techniques are provided to compensate for changes in a reference frequency provided by a crystal as part of a crystal oscillator. For example, temperatures associated with a crystal and with at least one module connected to the crystal by one or more conductive connections, e.g., voltage connections, are monitored. The temperature associated with the crystal, and an effect on a temperature of the crystal due to temperature changes of the at least one module, are used to estimate crystal frequency or a change in crystal frequency. This estimated crystal frequency or change in crystal frequency is used to adjust processing such as acquiring or maintaining a fix on a satellite signal.

Figure 1:
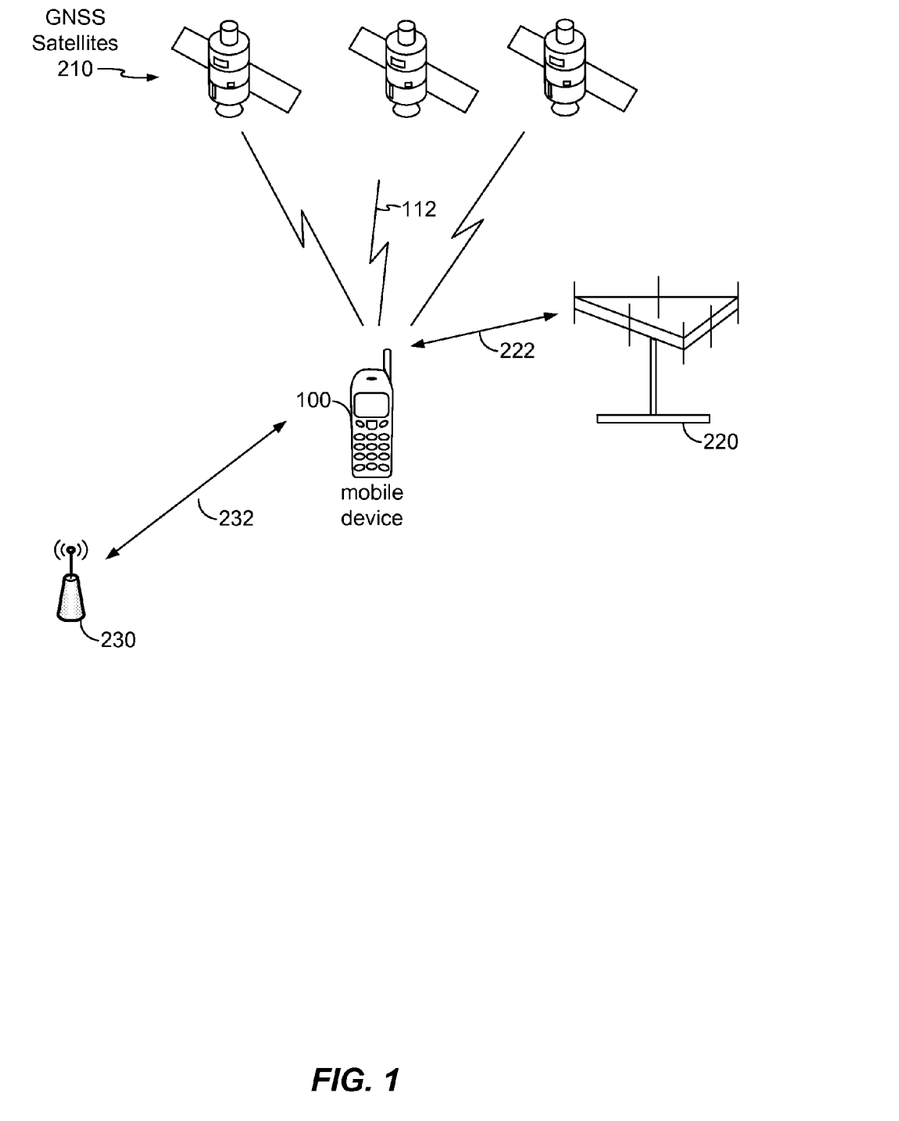
FIG. 1 is a schematic view of a telecommunications and positioning system.

Referring to FIG. 1, a communication system 10 includes GNSS (Global Navigation Satellite System) satellites 210, a base station 220, an access point 230, and a mobile telecommunication device 100. The mobile device 100 is configured to receive signals from the satellites 210 via links 112. The mobile device 100 is further configured to communicate bidirectionally with the base station 220 and the access point 230 via communication links 222, 232, respectively.

Figure 2:
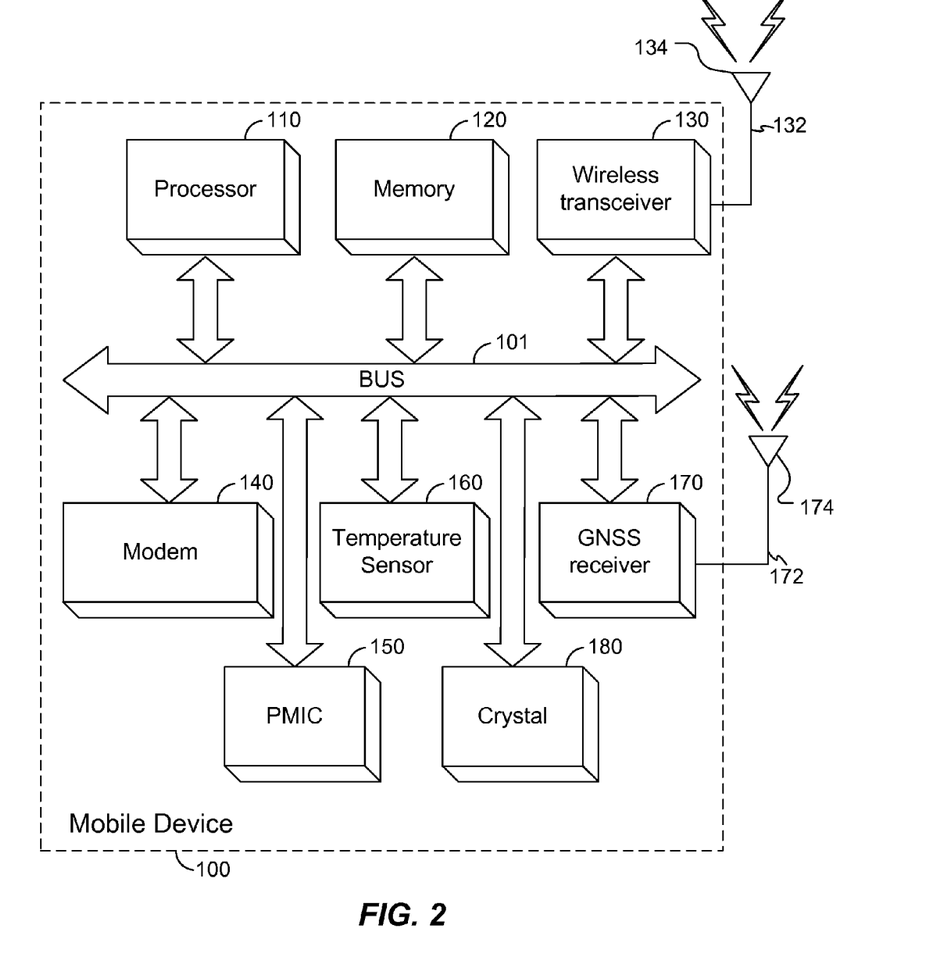
FIG. 2 is a block diagram of a mobile device shown in FIG. 1.

Referring also to FIG. 2, the mobile device 100 includes a computer system including a general-purpose processor 110, a memory 120, a wireless transceiver 130, a modem 140, a power management integrated circuit (PMIC) 150, a temperature sensor 160, a GNSS receiver 170, and a crystal 180 connected to each other by a bus 101. The connection to the bus 101 is for functional illustration as one or more of these devices may not be physically connected directly to the bus 101, e.g., being connected to the bus 101 through one or more of the other devices. The wireless transceiver 130 is connected by a line 132 to an antenna 134 for sending and receiving communications to/from the base station 220 and the access point 230 shown in FIG. 1. The GNSS receiver 170 is connected by a line 172 to an antenna 174 for receiving location signals (signals from which, at least in part, location can be determined) from the satellites 210 shown in FIG. 1. The processor 110 is preferably an intelligent device, e.g., a personal computer central processing unit (CPU) such as those made by Intel® Corporation, AMD®, or ARM, a microcontroller, an application specific integrated circuit (ASIC), an application processor made by Samsung® or Texas Instruments, etc. The memory 120 is a non-transitory storage device that includes random access memory (RAM) and read-only memory (ROM). The memory 120 stores processor-readable, processor-executable software code containing instructions for controlling the processor 110 to perform functions described herein (although the description may read that the software performs the function(s)). The functions implement a positioning system. The software can be loaded onto the memory 120 by being downloaded via a network connection, uploaded from a disk, etc. Further, the software may not be directly executable, e.g., requiring compiling before execution.

The crystal 180 is configured to produce a reference signal with a reference frequency for use in acquiring signals received by the antenna 174. The reference frequency produced by the crystal 180 is a function of temperature, i.e., the reference frequency is dependent upon the temperature of the crystal 180 and thus will change with changes in the temperature of the crystal 180. For example, the frequency of the crystal 180 as a function of temperature can be represented by an FT (frequency-temperature) curve according to $$f(t,t_p) = c_3(t-t_0)^3 + c_2(t-t_0)^2 + c_1(t-t_0) + c_0 + c_p(t_p - t_{p0}) \quad (1)$$

where $c_0$, $c_1$, $c_2$, $c_3$ are temperature-gradient constants, with $c_1$ between 0.1 ppm/°C. and 0.40 ppm/°C., $t_0$=30°C., t being the present actual crystal temperature, $t_p$ being the temperature of the PMIC 150, and $t_{p0}$ being a reference temperature at which there are zero contributions to the oscillator frequency.

The PMIC 150 is connected and configured to provide power to components of the mobile device 100 and to provide voltage to the crystal 180. Along with the desired power, the connections from the PMIC 150 to the crystal 180 may transfer undesired heat. As discussed below, indications of this heat can be measured and the measured heat indications used to compensate for changes in crystal reference frequency. Further, while the PMIC 150 is discussed in this example, one or more other components may transfer heat to the crystal 180 and heat associated with this(these) component(s) may be monitored, e.g., with one or more temperature sensors and used to measure indications of heat that are used to compensate for changes in the crystal's frequency. Thus, the discussion below applies to such other component(s) in addition to, or instead of, the PMIC 150.

The software in the memory 120 is configured to enable the processor 110 to communicate with the PMIC 150, as discussed further below, to obtain temperature indications relevant to the crystal 180. The processor 110 can use these temperature indications to estimate a temperature of the crystal (as discussed below) to estimate a frequency of a signal produced by the crystal 180 according to Eqn. (1).

Figure 3:
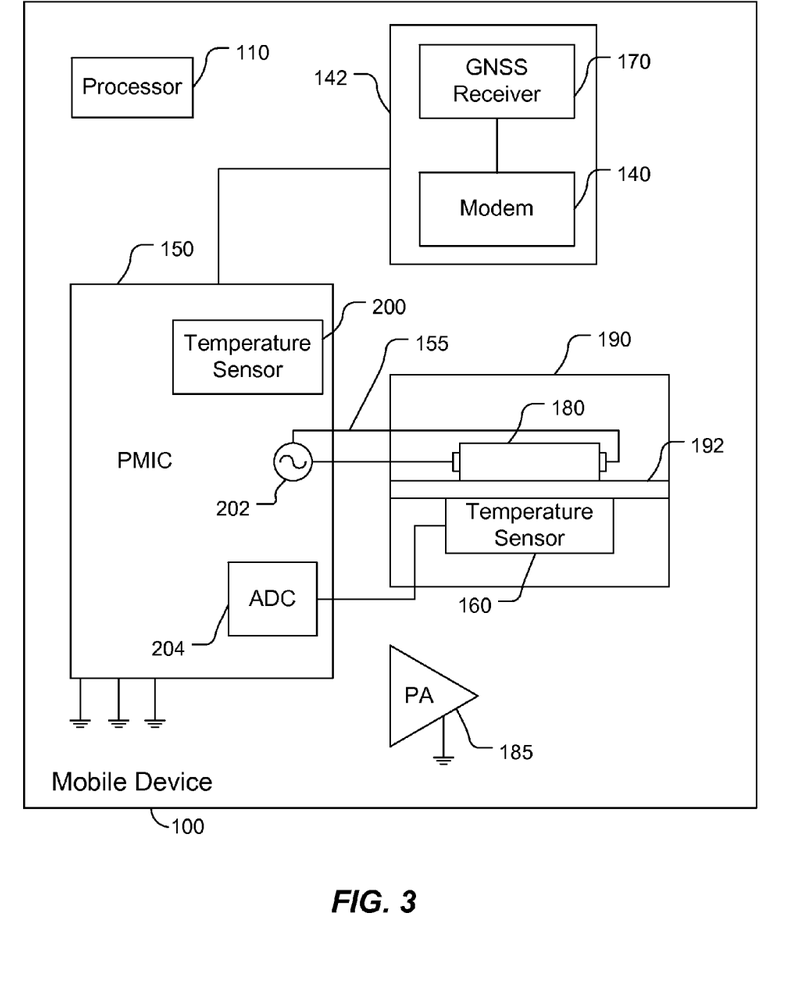
FIG. 3 is a block diagram of portions of the mobile device shown in FIG. 2.

Referring to FIG. 3, the mobile device 100 includes the PMIC 150, the crystal 180, the GNSS receiver 170, the modem 140, the temperature sensor 160, the processor 110, and a power amplifier 185. In this example, the crystal 180 and the temperature sensor 160 are disposed on opposite sides of a circuit board 192 in a dual-cavity housing 190. Other configurations may be used, e.g., with the sensor 160 on the same side of the circuit board 192 as the crystal 180. The housing 190 is disposed on a ground island to isolate the housing 190, and thus the crystal 180, from heat transfer through ground from sources such as the PMIC 150 and the power amplifier 185.

The temperature sensor 160 is configured and disposed to determine a temperature associated with the crystal 180. The sensor 160 is preferably disposed such that it experiences a similar environmental temperature as the crystal 180, including influences from the crystal 180, and will thus, in a steady-state environment, be at or near (e.g., although not necessarily, within about 1°C.) the temperature of the crystal 180. For example, the sensor 160 can be a thermistor adjacent to the crystal 180 to measure/sense the temperature in the area of the crystal 180. The power amplifier (PA) 185, which produces significant amounts of heat (e.g., 1W of heat a maximum power), is grounded and the PMIC 150 has multiple ground connections, with the PA 185 and the PMIC 150 connected to the same (i.e., a common) ground plane. Consequently, heat from the power amplifier 185 is transferred through the ground plane to the PMIC 150.

The PMIC 150 includes a temperature sensor 200, an oscillator 202, and an analog-to-digital converter (ADC) 204. The oscillator 202 in the PMIC 150 is connected to the crystal 180 by voltage lines 155 that are electrically and thermally conductive, e.g., copper wires. Consequently, it has been discovered, when the temperature of the PMIC 150 (and thus the temperature measured by the sensor 200) changes, heat quickly flows to or from the crystal 180 via the lines 155, faster than ambient heat or ground-plane-transfer heat is conveyed into the housing 190. Thus, the actual temperature of the crystal 180 leads the temperature measured by the sensor 160 (the temperature measured by the sensor 160 lags the temperature of the crystal 180). Due to heat from the lines 155, the temperature of the crystal 180 may change quickly, faster than the temperature of the crystal 180, and thus faster than the temperature changes indicated by the temperature sensor 160. That is, the temperature of the crystal 180 may deviate from the temperature indicated by the temperature sensor 160. This may be due to one or more of various reasons such as time for heat from the crystal 180 to radiate and be measured by the sensor 160. As another possible reason, in this example, with the crystal 180 separated from the temperature sensor 160 on an opposite side of the crystal 180, the heating or cooling of the crystal 180 due to heat transfer over the lines 155 may take time to propagate to the sensor 160 and thus may take time to be reflected in the temperature sensed by the sensor 160.

The temperature sensor 200 of the PMIC 150 is configured and disposed to sense the temperature of the PMIC 150, preferably adjacent to or near the thermally conductive connection(s) to the crystal 180, and provide indications of the PMIC temperature to the processor 110. The sensor 200 is disposed and configured to measure temperature indicative of heat transfer to/from the crystal 180. Preferably, the sensor 200 is on the same die as the oscillator 202. The sensor 200 is preferably disposed such that it experiences a similar environmental temperature as the oscillator 202 and will thus, in a steady-state environment, be at or near (e.g., although not necessarily, within about 1° C.) the temperature of the oscillator 202.

The ADC 204 is connected, here selectively connected, to the temperature sensors 160, 200. The sensors 160, 200 preferably measure the temperature constantly and the ADC 204 alternates between monitoring the sensor 160 and the sensor 200, e.g., every 20 ms or every 100 ms. The ADC 204 is configured to provide indications from which the temperatures measured by the sensors 160, 200 can be determined. For example, while many other configurations may be used, the ADC 204 may be coupled to the sensor 160 through a voltage divider (not shown) and converts an analog voltage provided by the sensor 160 into digital form. The digital indication of voltage (which is an indication of the temperature measured by the sensor 160) is provided by the ADC 204 to the processor 110 that is configured to use the voltage indication in an appropriate formula to determine the temperature measured by the sensor 160. The ADC 204 can relay indications of the temperatures sensed/measured by the sensors 160, 200 to the processor 110. The processor 110 can use the indications to calculate the temperatures sensed by the sensor 160, 200 and to use the sensed temperatures to calculate a frequency output of the crystal 180.

The processor 110 is configured determine the temperatures measured by the sensors 160, 200 and to calculate the frequency of the crystal 180 based on the temperatures measured by the sensors 160, 200. The processor 110 can calculate an estimated present temperature of the crystal 180 based on the temperatures measured by the sensors 160, 200 (as calculated by the processor 110 from voltages provided by the sensors 160, 200). The crystal temperature is a combination of the temperature measured by the sensor 160 and a function of the temperature measured by the sensor 200 according to $$T_{crystal} = T_{xo} + F(T_{PMIC}, T_{xo}) \quad (2)$$

where $T_{crystal}$ is the actual temperature of the crystal 180, $T_{xo}$ is the temperature sensed by the temperature sensor 160 (the crystal sensor temperature), and $T_{PMIC}$ is the temperature of the PMIC 150. The function F may take a variety of forms. For example, the function F could be a function of a difference of the PMIC and crystal sensor temperatures, i.e., $F(T_{PMIC} - T_{xo})$. The function F can be determined by experimentation and may take a variety of forms designed to be used in Eqn. (2) to adjust the sensed crystal temperature from the sensor 160 to the actual temperature of the crystal 180. For example, the processor 110 can calculate the crystal temperature using Eqn. (2) by applying a formula programmed in the memory 120 for the function $F(T_{PMIC}, T_{xo})$. The formula F provides filtering and a delay (e.g., due to separation of the heat source, here the PMIC 150, and the crystal, e.g., about 0.5 seconds), to affect a magnitude and timing of effect of PMIC temperature change on estimated crystal temperature. Thus, the amount and timing of the change in estimated crystal temperature will not be equal to the PMIC temperature change as soon as the PMIC temperature increases, as there is less heat transfer than the total PMIC temperature change implies and there is a delay between the PMIC temperature change and the actual crystal temperature change. The function F includes calibration parameters affecting the amounts of filtering and delay, e.g, for the specific mobile device design, or even the individual mobile device 100. These calibration parameters can be based on experimental data for the design by changing (e.g., cycling) temperature in the PMIC 150, or for each specific mobile device 100, e.g., obtained during manufacture (e.g., test or calibration).

Figure 4:
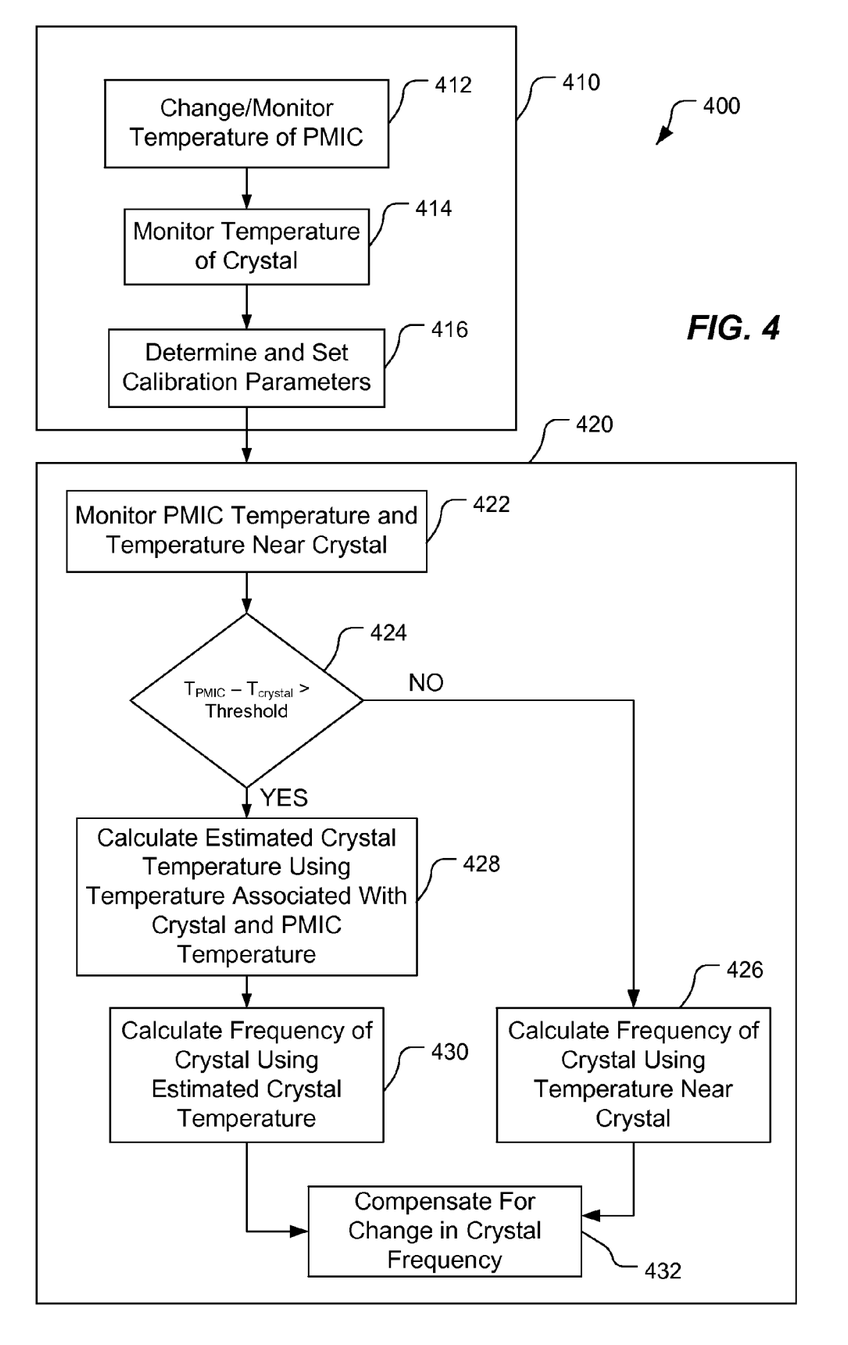
FIG. 4 is a block flow diagram of a process for compensating for temperature effects on a reference frequency provided by a crystal.

Referring to FIG. 4, with further reference to FIGS. 1-3, a process 400 of calibrating and using the processor 110 to compensate for temperature effects on the reference frequency provided by the crystal 180 includes the stages shown. The process 400 is, however, an example only and not limiting. The process 400 can be altered, e.g., by having stages added, removed, rearranged, combined, and/or performed concurrently. For example, stages 424 and 426 could be eliminated. The process 400 includes two sections, a calibration section 410 and a use section 420. The calibration section 410 includes stages 412, 414, and 416 and the use section 420 includes stages 422, 424, 426, 428, and 430. The calibration section 410 may be performed once, e.g., during manufacture of the mobile device 100, or repeatedly, e.g., periodically over time. The use section 420 is performed in an ongoing manner after manufacture, e.g., whenever the mobile device 100 is turned on.

At stage 412, the temperature of the PMIC 150 is changed. For example, step increases and decreases in the temperature are applied repeatedly to the PMIC 150 with the crystal temperature at various values. The temperature of the PMIC 150, preferably proximate to the thermally conductive connection to the crystal 180, is monitored by the temperature sensor 200 and the sensor 200 provides indications of the PMIC temperatures to the processor 150. The processor determines the temperatures of the PMIC 150 by processing the indications of the temperatures provided to the processor 110 by the sensor 200.

At stage 414, the temperature of the crystal 180 is monitored. A sensor is connected to the crystal 180 to measure the actual temperature $T_{crystal}$ of the crystal and provide indications of the actual crystal temperature to the processor 110. Additionally, the temperature sensor 160 senses the temperatures proximate to the crystal 180 and provides indications of the crystal sensor temperatures, to the processor 110, induced by the changes in the PMIC temperature. The processor 110 determines the crystal sensor temperature, the PMIC temperature, and the actual crystal temperature by processing the indications from the sensors 160, 200 and from the sensor connected to the crystal 180.

At stage 416, the processor 110 determines and sets the calibration parameters of the FT curve for the crystal 180. The processor 110 analyzes the PMIC temperatures $T_{PMIC}$ from the sensor 200, the crystal sensor temperatures $T_{xo}$ from the sensor 160, and the actual crystal temperatures $T_{crystal}$ to determine calibration parameters for the function F of Eqn. (2) so that the actual crystal temperature $T_{crystal}$ can be determined accurately from Eqn. (2). These calibration parameters are stored in the memory 120.

At stage 422, the temperatures of the PMIC 150 and the crystal 180 are monitored. The sensors 160, 200 sense their respective temperatures in an on-going manner and the ADC 204 switches between connections to the sensor 160 and the sensor 200 to monitor the sensed temperatures of the PMIC 150 and the crystal 180. Indications of these temperatures are provided to the processor 110 that determines the temperatures. Thus, indications of temperature near the crystal 180 and indications of heat transfer between the PMIC 150 and the crystal 180 (and temperature changes induced by such heat transfer) are determined.

At stage 424, an inquiry is made as to whether a relationship between the sensed PMIC temperature $T_{PMIC}$ from the sensor 200 and the crystal sensor temperature $T_{xo}$ from the sensor 160 are indicative of determining a predicted crystal temperature being desirable or not. That is, the processor 110 determines whether the crystal sensor temperature $T_{XO}$ is likely to be undesirably different from (i.e., presently undesirably deviating from) the actual crystal temperature $T_{crystal}$ such that the sensed temperature $T_{XO}$ from the sensor 160 will not yield an acceptably accurate value for the reference frequency if used in Eqn. (1). Here, the processor 110 determines whether a difference between the sensed PMIC temperature $T_{PMIC}$ from the sensor 200 and the crystal sensor temperature $T_{XO}$ from the sensor 160 is greater than a threshold. If not, then an adjustment to the crystal sensor temperature $T_{XO}$ is not determined and the process 400 proceeds to stage 426. If so, then an adjustment to the crystal sensor temperature $T_{XO}$ is desirable and the process 400 proceeds to stage 428.

At stage 426, the processor 110 calculates the frequency of the crystal 180 using the sensed temperature from the sensor 160. With the crystal temperature likely to be at or near the crystal sensor temperature from the sensor 160, the sensed temperature $T_{XO}$ from the sensor 160 is used as the actual crystal temperature t in Eqn. (1) to determine the reference frequency provided by the crystal 180.

At stage 428, the processor 110 calculates the estimated actual crystal temperature $T_{crystal}$ using the temperature near the crystal 180, i.e., the crystal sensor temperature $T_{XO}$ sensed by the sensor 160, and the PMIC temperature $T_{PMIC}$ sensed by the sensor 200. The processor 110 uses Eqn. (2), including the calibration parameters determined during the calibration section 410, to determine the estimated actual crystal temperature $T_{crystal}$. Thus, the processor 110 determines a temperature adjustment and adjusts the sensed temperature $T_{XO}$ from the sensor 160 using the PMIC temperature $T_{PMIC}$ and the calibration parameters. Alternatively, a change in the estimated crystal temperature can be determined, without determining the estimated crystal temperature itself.

At stage 430, the processor 110 calculates the frequency of the crystal using the estimated actual crystal temperature $T_{crystal}$ determined at stage 428. The estimated crystal temperature $T_{crystal}$ is used as the actual crystal temperature t in Eqn. (1) to determine the reference frequency provided by the crystal 180. Alternatively, a change in the estimated crystal frequency can be determined, without determining the estimated crystal frequency itself.

At stage 432, the calculated frequency, or change in the frequency, of the crystal 180 is used to compensate for changes of the reference frequency provided by the crystal 180 for processing data or signals in the mobile device 100. For example, the reference frequency or change in the reference frequency from the crystal 180 may be used to adjust a frequency used to obtain, acquire, or maintain a GNSS fix to determine location of the mobile device 100. For example, the reference frequency or change in the reference frequency may be used to produce an adjustment of a multiplier of a local oscillator in the mobile device. The reference frequency or change in the reference frequency may be used to digitally rotate frequencies, e.g., of received GNSS signals, to compensate for the actual value of the reference frequency compared to an expected value of the reference frequency.

Other Considerations

While the discussion above focused on the PMIC 150, other components of the mobile device 100 that are connected to the crystal 180 could also or alternatively be measured for temperature effects upon the crystal 180. Thus, a component of a mobile device other than a PMIC that may transfer heat to or from a crystal may be monitored to help determine temperature effect upon the crystal, particularly if the component is connected via a conductive line, e.g., a copper line, that may change the temperature of the crystal faster than will be reflected in readings from a temperature sensor adjacent to the crystal.

Figure 5:
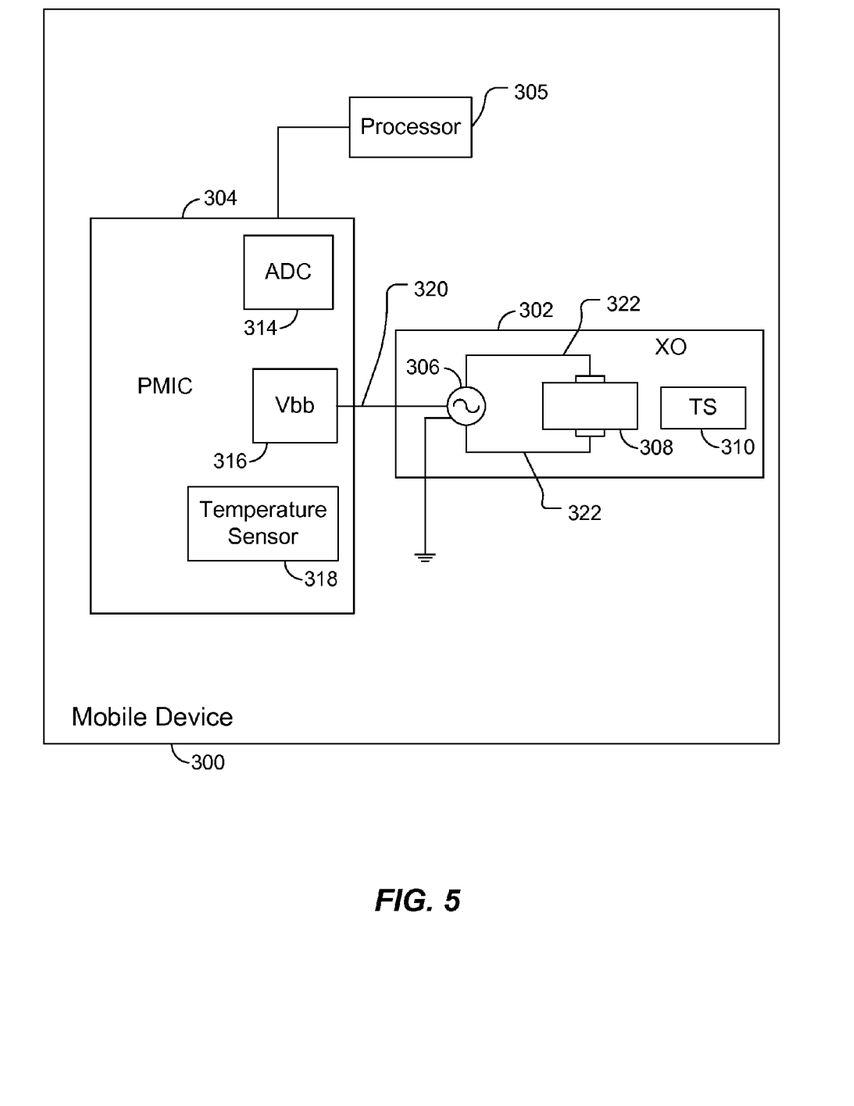
FIG. 5 is a block diagram of an alternative configuration of portions of a mobile device.

Further, other configurations of mobile devices may be used. Referring to FIG. 5, a mobile device 300 includes a crystal oscillator (XO) 302, a PMIC 304, and a processor 305. The XO 302 includes an oscillator 306, a crystal 308, and a temperature sensor 310. The oscillator 306 is connected by two voltage lines to the crystal 308 to actuate the crystal 308. The temperature sensor 310 is disposed to experience a temperature similar to that of the crystal 308 and is configured to measure this temperature. The PMIC includes an ADC 314, a voltage source (Vbb) 316, and a temperature sensor 318. The ADC 314 is coupled to the sensor 310 in the XO 302 and to the processor 305 to provide indications of the temperature sensed by the sensor 310. The voltage source 316 is connected to the oscillator 306, and the oscillator 306 is also connected to ground. Heat will be conveyed from the voltage source 316 to the oscillator 306 though an electrically and thermally conductive line 320 connecting the voltage source 316 to the oscillator 306. Some of this heat will further be conducted from the oscillator 306 to the crystal 308 through voltage lines 322 coupling the oscillator 306 and the crystal 308. The temperature sensor 318 is disposed and configured to measure temperature associated with the voltage source 316. The sensor 318 is also connected to the processor 312 and configured to provide indications to the processor 312 of heat transferred to the oscillator 306 from the voltage source 316. The processor 312 is configured to use these indications to determine a temperature effect on the frequency of the crystal 308 by applying an equation similar to Eqn. 2, with the function F being adjusted for this design, to determine frequency adjustments due to the temperature effect using Eqn. (1), and to use the frequency adjustments for processing of a crystal oscillator output signal.

Further still, the discussion regarding stages 428 and 430 discussed using the estimated actual crystal temperature $T_{crystal}$. As an alternative, the change in the estimated actual crystal temperature $T_{crystal}$ could be determined, used to determine an estimated change in the reference frequency of the crystal, and the estimated change in the reference frequency used in stage 432 to compensate for the change in crystal temperature.

Figure 6:
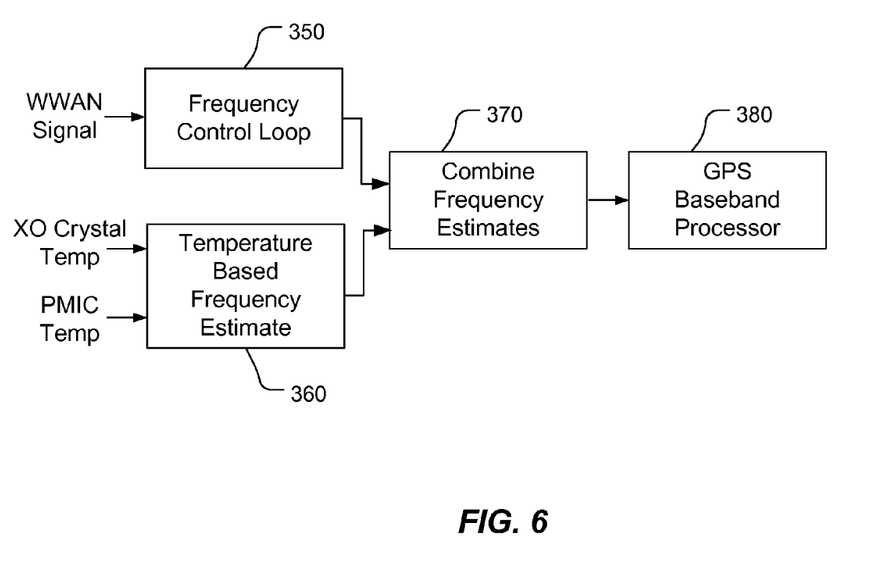
FIG. 6 is a block diagram of combining a temperature-based crystal frequency estimate with another frequency estimate and using the combined frequency estimate.

Also, referring to FIG. 6, other indications of the crystal frequency may be used to more accurately calculate the reference frequency of the crystal 180. Here, a wireless wide area network (WWAN) signal may be received by the antenna 134 and the transceiver 130 (FIG. 2) and indicate a frequency estimate. The signal may be processed through a frequency control loop 320, and combined 370 by the processor 110 with a temperature-based frequency estimate 360 (e.g., according to the process 400 discussed above). The combined frequency estimate can be provided to a GPS baseband processor 380 for further processing.

The methodologies described herein may be implemented by various means depending upon the application. For example, these methodologies may be implemented in hardware, firmware, software, or any combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media. Tangible media include one or more physical articles of machine readable media, such as random access memory, magnetic storage, optical storage media, and so on.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media. Such media also provide examples of non-transitory media, which can be machine readable, and wherein computers are an example of a machine that can read from such non-transitory media.

The generic principles discussed herein may be applied to other implementations without departing from the spirit or scope of the disclosure or claims.

What is claimed is:

1. A mobile device comprising:
   a memory that includes processor-readable instructions; and
   a processor communicatively coupled to the memory and configured to process the instructions to:
   obtain indications of first and second temperatures, the first temperature being a temperature associated with a crystal configured to provide a reference signal having a frequency, and the second temperature being a temperature associated with a component thermally coupled to the crystal;
   determine, based upon a combination of the first and second temperatures, an estimated frequency value associated with a reference frequency of the crystal; and
   compensate for a change in the reference frequency of the crystal based upon the estimated frequency value associated with the reference frequency.

2. The mobile device of claim 1 wherein to determine the estimated frequency value the processor is configured to process the instructions to:
   determine an estimated temperature value of the crystal, as a function of the combination of the first and second temperatures; and
   determine the estimated frequency value, associated with the reference frequency of the crystal, based upon the estimated temperature value.

3. The mobile device of claim 2 wherein the estimated temperature value is an estimated actual temperature of the crystal and the estimated frequency value is an estimated actual reference frequency of the crystal.

4. The mobile device of claim 2 wherein the estimated temperature value is an estimated change in actual temperature of the crystal and the estimated frequency value is an estimated change in actual reference frequency of the crystal.

5. The mobile device of claim 1 wherein the processor is configured to process the instructions to determine an estimated crystal temperature based on a difference of the first and second temperatures.

6. The mobile device of claim 1 wherein the processor is configured to process the instructions to determine an estimated crystal temperature in response to a difference of the first and second temperatures having a value indicative of the first temperature undesirably deviating from an actual temperature of the crystal.

7. The mobile device of claim 1 wherein the device is a mobile telecommunications device, the device further comprising:
   a receiver configured to receive location signals from a satellite;
   the crystal;
   a first temperature sensor disposed proximate to the crystal and configured to measure the first temperature;
   the component thermally connected to the crystal by an electrically and thermally conductive non-ground-plane connection; and
   a second temperature sensor disposed and configured to measure the second temperature;
   wherein either:
   the component is a first oscillator and the non-ground-plane connection includes a plurality of first voltage lines connecting the first oscillator to the crystal; or
   the component is a voltage source that is coupled to the crystal through a second oscillator, wherein the non-ground-plane connection includes a second voltage line connecting the voltage source to the second oscillator and a plurality of third voltage lines connecting the second oscillator to the crystal.

8. The mobile device of claim 7 wherein the first temperature sensor is a thermistor.

9. The mobile device of claim 7 wherein the second temperature sensor is disposed to measure heat provided to or removed from the crystal that will affect a temperature of the crystal faster than indicated by the first temperature measured by the first temperature sensor.

10. The mobile device of claim 7 wherein the processor is configured to compensate for the change in the value of the reference frequency of the crystal to process the location signals before a change in the temperature of the crystal due to heat transfer between the component and the crystal via the electrically and thermally conductive non-ground-plane connection is reflected in the first temperature.

11. The mobile device of claim 1 wherein the component is electrically and thermally coupled to the crystal through a non-ground-plane connection.

12. A method in a mobile communication device, the method comprising:

measuring a first temperature associated with a crystal configured to provide a reference signal having a frequency;

measuring a second temperature associated with a component that is coupled to the crystal by an electrically and thermally conductive line;

determining an estimated frequency value of the reference signal based upon a combination of the first and second temperatures; and compensating, based upon the estimated frequency value, for a change in the frequency of the reference signal of the crystal.

13. The method of claim 12 wherein the combination of the first and second temperatures comprises a difference of the first and second temperatures.

14. The method of claim 12 wherein determining the estimated frequency value comprises determining an estimated change in the frequency of the reference signal.

15. The method of claim 12 wherein measuring the second temperature measures an indication of heat provided to or removed from the crystal that will affect a temperature of the crystal faster than indicated by the first temperature.

16. The method of claim 12 wherein compensating for the change in the frequency of the reference signal is performed in response to a difference of the first and second temperatures having a value indicative of the first temperature undesirably deviating from an actual temperature of the crystal.

17. The method of claim 16 wherein the difference of the first and second temperatures having a value indicative of the first temperature undesirably deviating from an actual temperature of the crystal comprises the value of the difference exceeding a threshold.

18. The method of claim 12 further comprising determining an estimated crystal temperature value based on the combination of the first and second temperatures, wherein determining the estimated frequency value is based on the estimated crystal temperature value.

19. The method of claim 18 wherein determining the estimated crystal temperature value is based on a difference of the first and second temperatures.

20. A mobile device comprising:
first means for measuring a first temperature associated with a crystal configured to provide a reference signal having a frequency;
second means for measuring a second temperature associated with a component that is coupled to the crystal by an electrically and thermally conductive line;
frequency means for determining an estimated frequency value of the reference signal based upon a combination of the first and second temperatures; and
compensating means for compensating, based upon the estimated frequency value, for a change in the frequency of the reference signal of the crystal.

21. The mobile device of claim 20 wherein the frequency means is configured to determine the estimated frequency value by determining an estimated change in the frequency of the reference signal.

22. The mobile device of claim 20 wherein the second means for measuring is configured to measure the second temperature by measuring an indication of heat provided to or removed from the crystal that will affect a temperature of the crystal faster than indicated by the first temperature.

23. The mobile device of claim 20 wherein the compensating means is configured to compensate for the change in the frequency of the reference signal in response to a difference of the first and second temperatures having a value indicative of the first temperature undesirably deviating from an actual temperature of the crystal.

24. The mobile device of claim 23 wherein the difference of the first and second temperatures having a value indicative of the first temperature undesirably deviating from an actual temperature of the crystal comprises the value of the difference exceeding a threshold.

25. The mobile device of claim 20 further comprising estimating means for determining an estimated crystal temperature value based on the combination of the first and second temperatures, wherein the compensating means is configured to compensate for the change in the frequency of the reference signal based on the estimated crystal temperature value.

26. The mobile device of claim 25 wherein the estimating means is configured to determine the estimated crystal temperature value based on a difference of the first and second temperatures.

27. A processor-readable storage medium comprising processor-readable instructions configured to cause a processor to:
obtain indications of first and second temperatures, the first temperature being a temperature associated with a crystal configured to provide a reference signal having a frequency, and the second temperature being a temperature associated with a component thermally coupled to the crystal;
determine, based upon a combination of the first and second temperatures, an estimated frequency value associated with a reference frequency of the crystal
compensate for a change in the reference frequency of the crystal based upon the estimated frequency value associated with the reference frequency.

28. The storage medium of claim 27 wherein the instructions configured to cause the processor to determine the estimated frequency value include instructions configured to cause the processor to:
determine an estimated temperature value of the crystal, as a function of the combination of the first and second temperatures; and
determine the estimated frequency value, associated with the reference frequency of the crystal, based upon the estimated crystal temperature.

29. The storage medium of claim 28 wherein the estimated temperature value is an estimated actual temperature of the crystal and the estimated frequency value is an estimated actual reference frequency of the crystal.

30. The storage medium of claim 28 wherein the estimated temperature value is an estimated change in actual temperature of the crystal and the estimated frequency value is an estimated change in actual reference frequency of the crystal.

31. The storage medium of claim 27 wherein the instructions are configured to cause the processor to determine an estimated crystal temperature based on a difference of the first and second temperatures.

32. The storage medium of claim 27 wherein the instructions are configured to cause the processor to determine an estimated crystal temperature in response to a difference of the first and second temperatures having a value indicative of the first temperature undesirably deviating from an actual temperature of the crystal.

* * * * *